(12) United States Patent
Wu et al.

(10) Patent No.: US 10,249,796 B2
(45) Date of Patent: Apr. 2, 2019

(54) LIGHT EMITTING DIODE AND METHOD OF MANUFACTURING THEREOF

(71) Applicants: BOE TECHNOLOGY GROUP CO., LTD., Beijing (CN); BOE (Hebei) Mobile Display Technology Co., Ltd., Gu'An, Hebei (CN)

(72) Inventors: Jianjie Wu, Beijing (CN); Lili Chen, Beijing (CN); Ruijun Dong, Beijing (CN); Chenru Wang, Beijing (CN); Guangquan Wang, Beijing (CN); Haiwei Sun, Beijing (CN)

(73) Assignees: BOE TECHNOLOGY GROUP CO., LTD., Beijing (CN); BOE (Hebei) Mobile Display Technology Co., Ltd., Gu'An, Hebei (CN)

(*) Notice: Subject to any disclaimer, the term of this patent is extended or adjusted under 35 U.S.C. 154(b) by 270 days.

(21) Appl. No.: 15/031,766

(22) PCT Filed: Dec. 10, 2015

(86) PCT No.: PCT/CN2015/096942
§ 371 (c)(1),
(2) Date: Apr. 25, 2016

(87) PCT Pub. No.: WO2016/192363
PCT Pub. Date: Dec. 8, 2016

(65) Prior Publication Data
US 2018/0145221 A1    May 24, 2018

(30) Foreign Application Priority Data
Jun. 4, 2015   (CN) .......................... 2015 1 0303480

(51) Int. Cl.
H01L 29/06    (2006.01)
H01L 33/38    (2010.01)
(Continued)

(52) U.S. Cl.
CPC .......... *H01L 33/38* (2013.01); *H01L 33/0095* (2013.01); *H01L 33/06* (2013.01);
(Continued)

(58) Field of Classification Search
None
See application file for complete search history.

(56) References Cited

U.S. PATENT DOCUMENTS 7,910,941 B2 * 3/2011 Chen .................. H01L 33/44
257/233
2008/0173887 A1 * 7/2008 Baba .................. H01L 33/20
257/98
(Continued)

FOREIGN PATENT DOCUMENTS

CN    101378100 A    3/2009
CN    102074627 A    5/2011
(Continued)

OTHER PUBLICATIONS

First Office Action in the Chinese Patent Application No. 201510303480.3, dated Jun. 20, 2017; English translation attached.
(Continued)

*Primary Examiner* — Kevin M Picardat
(74) *Attorney, Agent, or Firm* — Intellectual Valley Law, P.C.

(57) ABSTRACT

The present application discloses a light emitting diode comprising a substrate; and a light emitting layer on the substrate. The light emitting layer comprises, an N-type doped layer; a quantum well active layer; and a P-type doped layer. At least one of the N-type doped layer and the P-type doped layer comprises an uneven layer adapted to concentrate light emitting from the light emitting layer.

20 Claims, 5 Drawing Sheets

(51) Int. Cl.
    H01L 33/20    (2010.01)
    H01L 33/46    (2010.01)
    H01L 33/00    (2010.01)
    H01L 33/06    (2010.01)
    H01L 33/40    (2010.01)

(52) U.S. Cl.
    CPC .............. *H01L 33/20* (2013.01); *H01L 33/40* (2013.01); *H01L 33/46* (2013.01); *H01L 2933/0008* (2013.01)

(56) References Cited

U.S. PATENT DOCUMENTS

| | | | |
|---|---|---|---|
| 2011/0114980 A1 | 5/2011 | Lee et al. | |
| 2011/0297914 A1* | 12/2011 | Zheng | H01L 33/46 257/13 |
| 2013/0240938 A1* | 9/2013 | Kim | H01L 33/20 257/98 |
| 2013/0260493 A1 | 10/2013 | Jin et al. | |
| 2014/0256071 A1* | 9/2014 | Park | H01L 33/46 438/27 |
| 2015/0083992 A1* | 3/2015 | Kanto | H01L 33/0095 257/13 |

FOREIGN PATENT DOCUMENTS

| | | |
|---|---|---|
| CN | 102130258 A | 7/2011 |
| CN | 102280816 A | 12/2011 |
| CN | 103367562 A | 10/2013 |
| CN | 105098014 A | 11/2015 |

OTHER PUBLICATIONS

International Search Report & Written Opinion dated Mar. 3, 2016 regarding PCT/CN2015/096942.
Second Office Action in the Chinese Patent Application No. 201510303480.3, dated Feb. 24, 2018; English translation attached.

* cited by examiner

LIGHT EMITTING DIODE AND METHOD OF MANUFACTURING THEREOF

CROSS-REFERENCE TO RELATED APPLICATION

This application is a national stage application under 35 U.S.C. § 371 of International Application No. PCT/CN2015/096942 filed Dec. 10, 2015, which claims priority to Chinese Patent Application No. 201510303480.3, filed Jun. 4, 2015, the contents of which are incorporated by reference in the entirety.

FIELD

The present invention relates to electronic light emitting device, more particularly, to a light emitting diode and a method of manufacturing thereof.

BACKGROUND

Typically, a conventional light emitting device is of a Lambertian type. In a Lambertian type light emitting device, light is emitted in all directions so that only a portion of the light can be utilized for its intended purpose. The majority of the light is absorbed within the device. For example, the light may be emitted laterally, reflected and trapped internally, and ultimately absorbed by various high optical index layers within the device. In general, about 80% of the light may be lost in a conventional light emitting device.

SUMMARY

In one aspect, the present invention provides a light emitting diode comprising a substrate; and a light emitting layer on the substrate. The light emitting layer comprises, an N-type doped layer; a quantum well active layer; and a P-type doped layer. At least one of the N-type doped layer and the P-type doped layer comprises an uneven layer adapted to concentrate light emitting from the light emitting layer.

Optionally, the N-type doped layer, the quantum well active layer and the P-type doped layer sequentially arranged along a direction away from the substrate, and the P-type doped layer comprising the uneven layer.

Optionally, the uneven layer comprises a base layer and a plurality of ridges spaced apart on the base layer, a width of a cross-section of at least a portion of the ridge decreases gradually along emitting direction of the light emitting layer.

Optionally, the portion of the ridge has a cross-section selected from the group consisting of trapezoid, triangle, arch, and semicircle.

Optionally, the plurality of ridges are integrally formed with the base layer as a single body.

Optionally, the substrate is made of a transparent material; the light emitting diode further comprises a reflective layer disposed on a bottom surface of the substrate and a side wall of the light emitting diode, reflecting light towards the light emitting layer.

Optionally, the reflective layer comprises silver and/or nickel.

Optionally, the light emitting diode further comprises a buffer layer sandwiched between the light emitting layer and the substrate.

Optionally, the light emitting diode further comprises a transparent protective layer on a surface of the P-type doped layer distal to the substrate.

Optionally, the transparent protective layer comprises silicon oxide or polytetrafluoroethylene.

Optionally, the light emitting diode further comprises an electrode. Optionally, the electrode comprises a P-type electrode plate on the P-type doped layer; an N-type electrode plate on the N-type doped layer; the P-type electrode plate and the N-type electrode plate are disposed along two peripheral sides of the light emitting layer, respectively; a P-type transparent electrode connected to the P-type electrode plate; an N-type transparent electrode connected to the N-type electrode plate; and the P-type transparent electrode and the N-type transparent electrode are spaced apart and not connected.

Optionally, the P-type transparent electrode and the N-type transparent electrode are selected from the group consisting of comb electrode, branched electrode, toroid electrode, and spiral-wound electrode.

Optionally, the P-type electrode plate comprises a P-type ohmic contact electrode plate in contact with the P-type doped layer and a P-type metal electrode plate in contact with the P-type ohmic contact electrode plate, the N-type electrode plate comprises an N-type ohmic contact electrode plate in contact with the N-type doped layer and an N-type metal electrode plate in contact with the N-type ohmic contact electrode plate, the P-type transparent electrode comprises a P-type ohmic contact electrode on the light emitting layer and a P-type transparent conductive electrode on the P-type ohmic contact electrode, and the N-type transparent electrode comprises an N-type ohmic contact electrode on the light emitting layer and an N-type transparent conductive electrode on the N-type ohmic contact electrode.

Optionally, the quantum well active layer comprises a quantum barrier layer disposed on the N-type doped layer and a quantum well layer disposed on the quantum barrier layer.

Optionally, the P-type doped layer comprises P-doped gallium nitride, the N-type doped layer comprises N-doped gallium nitride, the quantum barrier layer comprises gallium nitride and the quantum well layer comprises indium gallium nitride.

Optionally, the light emitting layer comprises an unintentionally doped N-type doped layer.

In another aspect, the present invention provides a method of manufacturing a light emitting diode. The method comprises forming a light emitting layer on a substrate. The step of forming the light emitting layer on the substrate comprises forming an N-type doped layer; forming a quantum well active layer on top of the N-type doped layer; forming a P-type doped layer on top of the quantum well active layer; forming a mask pattern comprising a plurality of strips disposed spaced apart on top of at least one of the N-type doped layer and the P-type doped layer; and etching at least one of the N-type doped layer and the P-type doped layer to form a plurality of ridges having a spacing and a top surface shape corresponding to those of the plurality of strips, a width of a cross-section of at least a portion of each of the plurality of ridges decreases gradually along emitting direction of the light emitting layer.

Optionally, the N-type doped layer, the quantum well active layer and the P-type doped layer sequentially arranged along a direction away from the substrate, and the P-type doped layer is etched to form the plurality of ridges.

Optionally, the portion of the ridge along the emitting direction of the light emitting layer has a cross-section selected from the group consisting of trapezoid, triangle, arch, and semicircle.

Optionally, the step of forming the mask pattern comprises forming a mask layer on top of the P-type doped layer; forming a photoresist layer on top of the mask layer; forming a photoresist pattern corresponding to the mask pattern; and etching the mask layer to form the mask pattern.

Optionally, the P-type doped layer is etched using an etching solution.

Optionally, the P-type doped layer comprises a P-type doped gallium nitride, and the etching solution is selected from the group consisting of hydrochloric acid solution, phosphoric acid solution, hydrofluoric acid solution, potassium hydroxide solution, aqua regia, potassium persulfate solution, sodium pyroborate solution, hydrogen peroxide solution, oxalic acid solution, ammonium fluoride solution, hydroiodic acid solution, and potassium iodide solution.

Optionally, the P-type doped layer is etched by dry etching.

Optionally, the P-type doped layer comprises a P-type doped gallium nitride, and the etching gas comprises boron chloride ($BCl_3$) and/or chloride ($Cl_2$).

Optionally, the method of manufacturing a light emitting diode further comprises forming a transparent protective layer on the light emitting layer.

Optionally, the transparent protective layer comprises silicon oxide or polytetraethylene.

Optionally, prior to the step of forming the light emitting layer, the method of manufacturing a light emitting diode further comprises forming a buffer layer on the substrate.

Optionally, the substrate is made of a transparent material, the method of manufacturing a light emitting diode further comprises forming a reflective layer disposed on a bottom surface of the substrate and a side wall of the light emitting layer, reflecting light towards the light emitting layer.

Optionally, the step of forming the light emitting layer further comprises etching the P-type doped layer having the plurality of ridges and the quantum well active layer to form a notch which extends through a portion of the P-type doped layer and a portion of the quantum well active layer, exposing a portion of a top surface of the N-type doped layer, wherein the notch is located on a peripheral side of the light emitting layer.

Optionally, the method of manufacturing a light emitting diode further comprises forming an electrode.

Optionally, the electrode comprises a P-type electrode plate on the P-type doped layer, an N-type electrode plate on the portion of the top surface of the N-type doped layer exposed by the notch, a P-type transparent electrode connected to the P-type electrode plate, and an N-type transparent electrode connected to the N-type electrode plate, the P-type transparent electrode and the N-type transparent electrode are spaced apart and not connected.

Optionally, the P-type electrode plate and the N-type electrode plate are disposed along two peripheral sides of the light emitting layer, respectively.

Optionally, the P-type electrode plate comprises a P-type ohmic contact electrode plate in contact with the P-type doped layer and a P-type metal electrode plate in contact with the P-type ohmic contact electrode plate, the N-type electrode plate comprises an N-type ohmic contact electrode plate in contact with the N-type doped layer and an N-type metal electrode plate in contact with the N-type ohmic contact electrode plate, the P-type transparent electrode comprises a P-type ohmic contact electrode on the light emitting layer and a P-type transparent conductive electrode on the P-type ohmic contact electrode, and the N-type transparent electrode comprises an N-type ohmic contact electrode on the light emitting layer and an N-type transparent conductive electrode on the N-type ohmic contact electrode.

Optionally, the step of forming the electrode comprises forming a metal pattern corresponding to the P-type electrode plate and the N-type electrode plate on the surface of the light emitting layer; forming a transparent electrode pattern corresponding to the P-type transparent electrode and the N-type transparent electrode; and annealing the metal pattern and the transparent electrode pattern under a nitrogen atmosphere; forming the P-type electrode plate comprising a P-type ohmic contact electrode plate and a P-type metal electrode plate, forming the N-type electrode plate comprising an N-type ohmic contact electrode plate and an N-type metal electrode plate, forming the P-type transparent electrode comprising a P-type ohmic contact electrode and a P-type transparent conductive electrode, forming the N-type transparent electrode comprising an N-type ohmic contact electrode and an N-type transparent conductive electrode.

Optionally, an annealing temperature in the range of 450° C. to 550° C. is used for the annealing.

Optionally, the step of forming a quantum well active layer on top of the N-type doped layer comprises forming a quantum barrier layer on top of the N-type doped layer; and forming a quantum well layer on top of the quantum barrier layer.

Optionally, the quantum well active layer comprises the quantum barrier layer and the quantum well layer.

Optionally, the P-type doped layer comprises P-doped gallium nitride, the N-type doped layer comprises N-doped gallium nitride, the quantum barrier layer comprises gallium nitride and the quantum well layer comprises indium gallium nitride.

Optionally, subsequent to the step of forming the quantum well active layer and prior to the step of forming the P-type doped layer, the step of forming the light emitting layer further comprises forming an unintentionally N-type doped layer.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
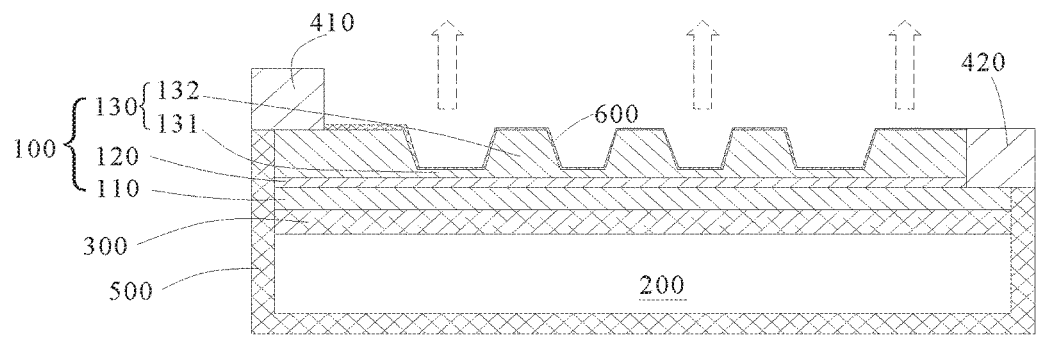
FIG. 1 is a cross-sectional view of a light emitting diode in one embodiment.
Figure 5:
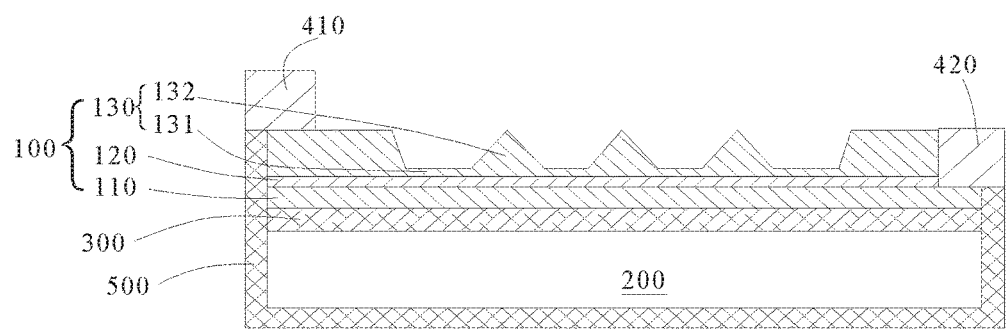
FIG. 5 is a cross-sectional view of a light emitting diode in another embodiment.
Figure 6:
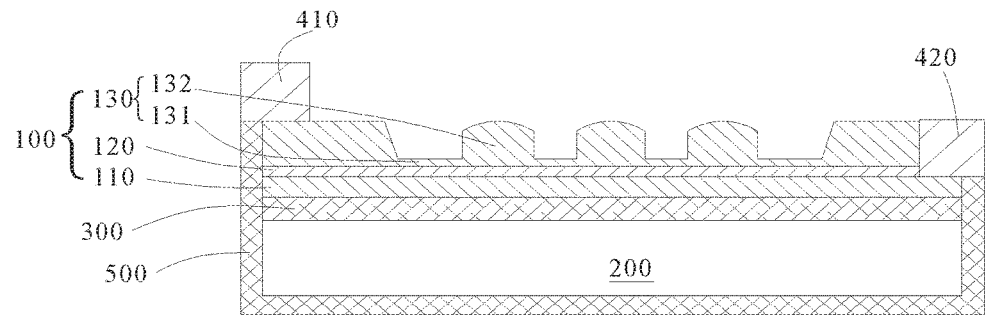
FIG. 6 is a cross-sectional view of a light emitting diode in another embodiment.

FIGS. 1, 5, and 6 are cross-sectional views of light emitting diodes in some embodiments. Referring to FIGS. 1, 5, and 6, the light emitting diodes in the embodiments include a light emitting layer 100 disposed on a substrate 200. The light emitting layer 100 includes, sequentially arranged along a direction away from the substrate 200, an N-type doped layer 110, a quantum well active layer 120, and a P-type doped layer 130 having an uneven layer structure. The uneven layer includes a base layer 131 and a concentrator (e.g., a plurality of ridges spaced apart on the base layer 131). The quantum well active layer 120 is sandwiched between the N-type doped layer 110 and the P-type doped layer 130. Optionally, the P-type doped layer 130 further includes a base layer 131. Optionally, the concentrator and the base layer 131 are integrally formed as a single body.

FIGS. 1, 5, and 6 illustrate an example in which the concentrator (e.g., the plurality of ridges) are disposed on the P-type doped layer. In some embodiments, the concentrator can be disposed on the N-type doped layer, the P-type doped layer, or both. In some embodiments, the light emitting diode includes a substrate 200 and a light emitting layer 100. The light emitting layer 100 includes an N-type doped layer 110, a quantum well active layer 120, and a P-type doped layer 130. Optionally, at least one of the N-type doped layer 110 and the P-type doped layer 130 includes a concentrator, for example, an uneven layer, adapted to concentrate light emitting from the light emitting layer 100. Optionally, both the N-type doped layer 110 and the P-type doped layer 130 include a concentrator, e.g., an uneven layer, adapted to concentrate light emitting from the light emitting layer 100.

The concentrator is adapted to focus and concentrate light emitting from the light emitting layer 100. Due to the presence of the concentrator, light emitted along directions other than the intended emitting direction of the light emitting layer (e.g., through the light emitting layer 100 outwardly and substantially away from the substrate 200) may be guided back to the intended emitting direction. For example, light emitted along a lateral direction (e.g., a direction substantially parallel to the surface of the light emitting layer 130) may be reflected by the concentrator so that it is redirected to the intended light emitting direction. Based on the above, internal light absorption is reduced and enhanced brightness can be achieved in the light emitting diode.

Any concentrator suitable for focusing and concentrating light may be used for making the light emitting diode. In some embodiments, the concentrator comprises a plurality of ridges 132 spaced apart on the base layer 131. Optionally, a width of a cross-section of at least a portion of the ridge 132 decreases gradually along emitting direction of the light emitting layer. The ridge 132 redirects light emitted along directions other than the intended emitting direction of the light emitting layer, e.g., laterally emitted light, back to the intended light emitting direction. The portion of the ridge 132 can have a cross-section of any suitable shape. Optionally, the portion of the ridge 132 has a cross-section selected from the group consisting of trapezoid, triangle, arch, and semicircle. Optionally, the portion of the ridge 132 has a cross-section of trapezoid (FIG. 1). Optionally, the portion of the ridge 132 has a cross-section of triangle (FIG. 5). Optionally, the ridge 132 has a cross-section which is a combination of an arc or semicircle on top of a rectangle (FIG. 6). Optionally, the ridge 131 and the base layer 132 are integrally formed as a single body.

Figure 3:
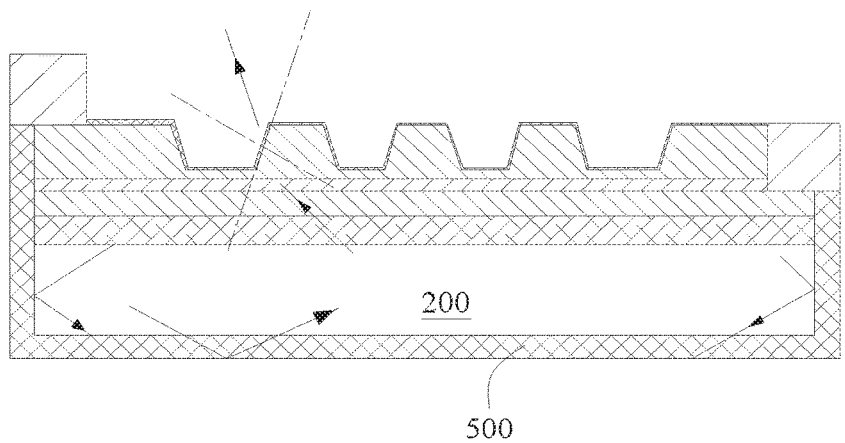
FIG. 3 is a diagram illustrating a light transmission path of a light emitting diode in an embodiment.

FIG. 3 is a diagram illustrating a light transmission path within a light emitting diode in an embodiment. Referring to FIG. 3, light emitting out from the side walls of the ridges 132 are redirected towards the intended light emitting direction (e.g., through the light emitting layer 100 outwardly and substantially away from the substrate 200). Similarly, light emitted from the light emitting layer 100 inwardly (e.g., towards the substrate 200) is reflected by the reflective layer 500 back to the light emitting layer 100. The reflected light is refracted by the light emitting layer 100 and transmitted outwardly. The refracted light is then focused and concentrated by the concentrator (e.g., the ridge 132) as discussed above. The top surface, the side surface and the end surface of the ridge 132 are all light emitting surfaces. Therefore, having a ridge 132 on the light emitting layer 100 also increases the total light emitting surface of the light emitting diode. Consequently, a larger portion of light generated by the light emitting diode emits through the surfaces of P-type doped layer 130 outwardly. The internal light absorption is much reduced, and brightness of the diode enhanced. Light utilization efficiency of the light emitting diode can be greatly enhanced at least by, e.g., use of the concentrator and the reflective layer 500.

The substrate 200 can be made of any suitable material. For example, the substrate can be made of a transparent material such as sapphire or silicon carbide. When the substrate 200 is made of a transparent material, the light emitting diode may optionally further include a reflective layer 500 for reflecting light towards the intended light emitting direction, e.g., towards to the top surface of the light emitting layer 100, through the light emitting layer 100 outwardly and substantially away from the substrate 200. The reflective layer 500 may be disposed on the bottom of the substrate 200 and/or the side wall of the light emitting diode. Optionally, the reflective layer 500 is disposed on both the bottom and the side wall of the light emitting diode. Optionally, the reflective layer 500 is disposed only on the bottom of the light emitting diode. Optionally, the reflective layer 500 is disposed only on the side wall of the light emitting diode. Optionally, the reflective layer 500 is disposed on top of the substrate 200 (e.g., a surface of the substrate 200 proximal to the light emitting layer 100). Optionally, the reflective layer 500 is disposed on top of the substrate 200 and/or the side wall of the light emitting diode. The reflective layer 500 can be made of any suitable material. Optionally, the reflective layer 500 comprises silver and/or nickel.

The light emitting diode may further include a buffer layer 300 sandwiched between the light emitting layer 100 and the substrate 200. Contamination of the light emitting layer 100 may be avoided or reduced by having a buffer layer 300. The buffer layer 300 can be made of any suitable material, for example, aluminum nitride, aluminum gallium nitride, or gallium nitride. Optionally, the buffer layer has a thickness in the range of around 1.5 µm to around 2.5 µm.

In some embodiments, the light emitting diode further includes a protective layer 600 on top of the light emitting layer 100 to protect the light emitting layer 100. As shown in FIG. 1, the light emitting diode in the embodiment has a protective layer 600 disposed on the top surface of the P-type doped layer 130. Optionally, the protective layer 600 has a relatively small refractive index, e.g., ≤2.3. The protective layer 600 can be made of any suitable material. Optionally, the protective layer includes silicon oxide or polytetrafluoroethylene. The protective layer modifies the surface of the light emitting layer 100, making the surface of the light emitting layer 100 smoother.

Figure 4:
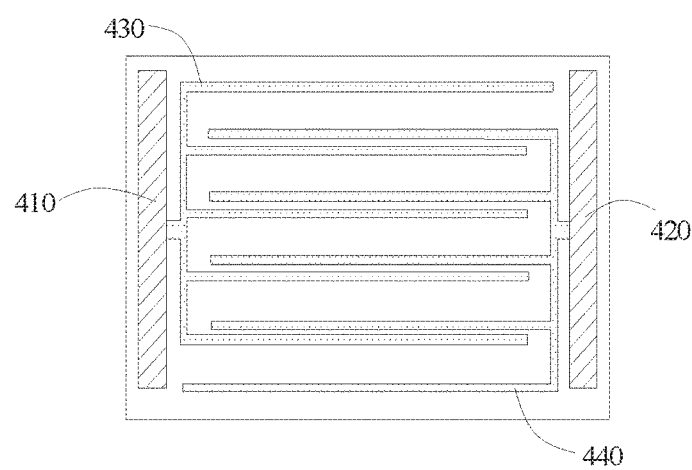
FIG. 4 is a diagram illustrating a light emitting diode in plan view in another embodiment.

FIG. 4 is a diagram illustrating the plan view of a light emitting diode in another embodiment. As shown in FIG. 4, the light emitting diode in the embodiment further includes an electrode. The electrode in the embodiment includes a P-type electrode plate 410 on the P-type doped layer 130, an N-type electrode plate 420 on the N-type doped layer 110, a P-type transparent electrode 430 connected to the P-type electrode plate 410, and an N-type transparent electrode 440 connected to the N-type electrode plate 420. Optionally, the P-type transparent electrode 430 and the N-type transparent electrode 440 are spaced apart and not connected.

In some embodiments, the P-type electrode plate 410 and the N-type electrode plate 420 are disposed on the outer surface of the P-type doped layer 130 (i.e., the surface distal to the substrate 200). Optionally, the P-type electrode plate 410 and the N-type electrode plate 420 are disposed along two peripheral sides of the light emitting layer 100, respectively. Referring to FIG. 4, the P-type electrode plate 410 and the N-type electrode plate 420 are disposed on the left and the right sides of the light emitting layer 100, respectively. The P-type transparent electrode 430 and the N-type transparent electrode 440 are disposed between the P-type electrode plate 410 and the N-type electrode plate 420.

In some embodiments, a plurality of light emitting diodes may be connected in series or in parallel via a plurality of lead wires. The electrode plates facilitate the connection between the lead wires and the light emitting diodes. Through the electrode plates, the lead wires connect the P-type electrode plate 410 and the N-type electrode plate 420 to a driver circuit. The driver circuit provides voltage signals through a first lead wire to the P-type electrode plate 410 and the P-type transparent electrode 430, and provides voltage signals through a second lead wire to the N-type electrode plate 420 and the N-type transparent electrode 440.

The electrode plate can be made of any shape. For example, the P-type transparent electrode 430 and the N-type transparent electrode 440 can be any of comb electrode (as shown in FIG. 4), branched electrode, toroid electrode, and spiral-wound electrode.

Referring to FIG. 1, the light emitting diode in the embodiment further includes a notch on the light emitting layer 100 (e.g., the space occupied by the N-type electrode plate 420). In some embodiments, the notch extends through a portion of the P-type doped layer 130 and a portion of the quantum well active layer 120, exposing a portion of a top surface of the N-type doped layer 110. Optionally, the N-type electrode plate 420 can be conveniently disposed on the top surface of the N-type doped layer 110 exposed by the notch. As discussed above, the N-type electrode plate 420 can be disposed on a peripheral side of the light emitting layer 100 to improve light utilization efficiency. Accordingly, the notch can also be located on a corresponding peripheral side of the light emitting layer 100.

To improve the conductive properties of the electrode, the P-type electrode plate 410 can optionally include a P-type ohmic contact electrode plate in contact with the P-type doped layer and a P-type metal electrode plate in contact with the P-type ohmic contact electrode plate. Optionally, the N-type electrode plate includes an N-type ohmic contact electrode plate in contact with the N-type doped layer and an N-type metal electrode plate in contact with the N-type ohmic contact electrode plate. Optionally, the P-type transparent electrode includes a P-type ohmic contact electrode on the light emitting layer and a P-type transparent conductive electrode on the P-type ohmic contact electrode. Optionally, the N-type transparent electrode includes an N-type ohmic contact electrode on the light emitting layer and an N-type transparent conductive electrode on the N-type ohmic contact electrode. Optionally, the P-type ohmic contact electrode plate is connected to the P-type ohmic contact electrode. Optionally, the N-type ohmic contact electrode plate is connected to the N-type ohmic contact electrode. Optionally, the P-type metal electrode plate is connected to the P-type transparent conductive electrode. Optionally, the N-type metal electrode plate is connected to the N-type transparent conductive electrode.

As used herein, the term "ohmic contact electrode" or "ohmic contact electrode plate" refers to an electrode (or an electrode plate) in which the characteristic of a current flowing through the electrode and the characteristic of a voltage across the electrode are symmetrical forward and backward in accordance with the Ohm's law. A contact between a metal/transparent conductive material and a semiconductor is either a Schottky contact or an ohmic contact. The Schottky contact has a rectification property so that a current does not flow in a reverse direction. In some embodiments, when an ohmic contact electrode is used, the contact resistance is reduced as much as possible. The term "contact resistance" is defined as a voltage to be applied so as to make a unit current flow through a unit contact surface. The unit of the contact resistance is $\Omega \cdot cm^2$. Having a P-type ohmic contact electrode plate between the P-type metal electrode plate and the P-type doped layer may eliminate Schottky contact between the P-type metal electrode plate and the P-type doped layer. Similarly, having an N-type ohmic contact electrode plate between the N-type metal electrode plate and the N-type doped layer may eliminate Schottky contact between the N-type metal electrode plate and the N-type doped layer. Having a P-type ohmic contact electrode between the P-type transparent conductive electrode and the P-type doped layer may eliminate Schottky contact between the P-type transparent conductive electrode and the P-type doped layer. Having an N-type ohmic contact electrode between the N-type transparent conductive electrode and the N-type doped layer may eliminate Schottky contact between the N-type transparent conductive electrode and the N-type doped layer. The P-type ohmic contact electrode plate, the N-type ohmic contact electrode plate, the P-type ohmic contact electrode, and the N-type ohmic contact electrode thus facilitate the migration of electrons into the quantum well active layer.

The light emitting layer 100 can be made of any suitable material. Depending on the choice of light color, various material can be selected for making the light emitting layer 100. For example, for emitting a white light, a P-type doped gallium nitride may be used for making the P-type doped layer 130, an N-type doped gallium nitride may be used for making the N-type doped layer 110, and/or an indium gallium nitride or gallium nitride material may be used for making the quantum well active layer 120.

Optionally, the quantum well active layer comprises a quantum barrier layer disposed on the N-type doped layer and a quantum well layer disposed on the quantum barrier layer. Optionally, the light emitting layer 100 further includes an unintentionally doped N-type doped layer.

Figure 7:
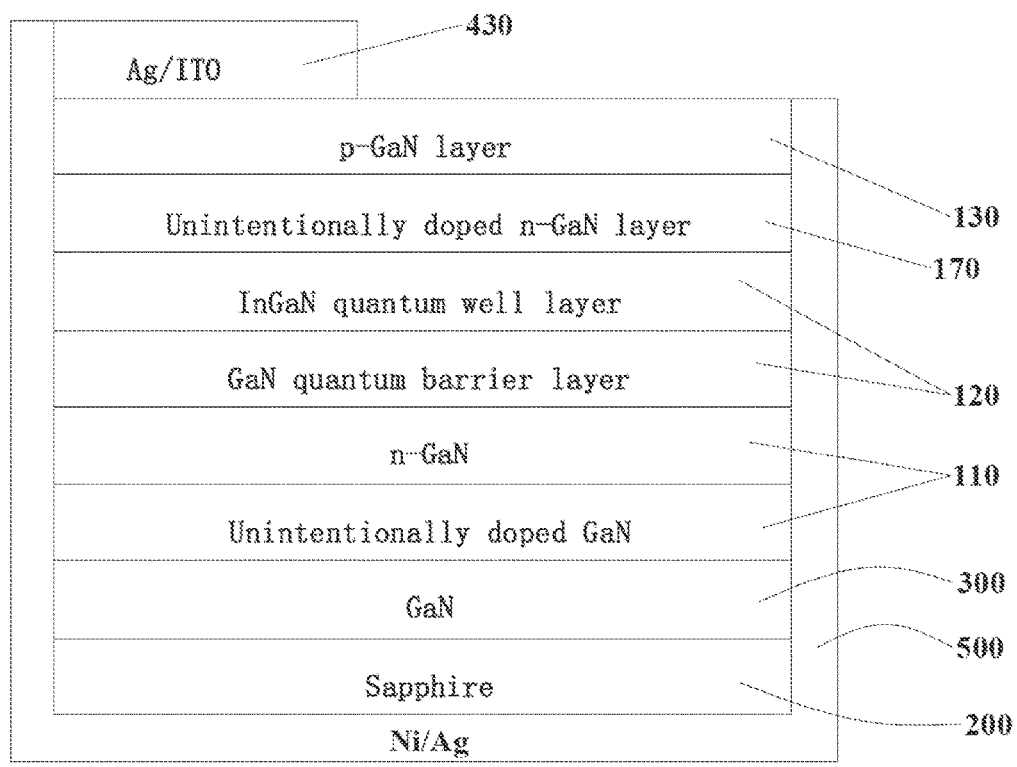
FIG. 7 is a diagram illustrating a layered structure of a light emitting diode in an embodiment.

FIG. 7 is a diagram illustrating a layered structure of a light emitting diode in an embodiment. Referring to FIG. 7, the light emitting diode in the embodiment includes a P-type transparent electrode 430, a P-type doped layer 130, an unintentionally N-type doped layer 170, a quantum well active layer 120 including a quantum well layer and a quantum barrier layer, an N-type doped layer 110, a buffer layer 300, a substrate 200, and a reflective layer 500. In the embodiment of FIG. 7, the reflective layer 500 is made of nickel and/or silver, the substrate 200 is made of sapphire, the buffer layer is made of gallium nitride, the quantum well layer is made of indium gallium nitride, the quantum barrier layer is made of gallium nitride, the P-type doped layer is made of P-type doped gallium nitride. The N-type doped layer 110 may include an unintentionally N-type doped sublayer. Optionally, an unintentionally N-type doped sublayer 170 is disposed between the P-type doped layer 130 and the quantum well active layer 120. The unintentionally N-type doped layer may be made of unintentionally N-type doped gallium nitride.

The P-type transparent electrode 430 may have a P-type transparent conductive electrode made of transparent metal wire or indium tin oxide. Optionally, the transparent metal wire is a nano-wire. For example, the transparent metal wire may be a nano-wire made of silver (e.g., 900 nm thick wire) to achieve low resistance. Optionally, the P-type transparent electrode 430 and the N-type transparent electrode 440 are made of the same material, e.g., a silver nano-wire or indium tin oxide. The voltage between the P-type transparent electrode 430 and the N-type transparent electrode 440 produces current. When the current passes through the light emitting layer 130, electrons migrate into the quantum wells of the quantum well active layer 120, trapped in a few to a few dozen quantum wells. Energy of the electrons are quantumized, resulting in discrete energy levels. Transition of electrons between discrete energy levels produces light.

This disclosure also provides a method of manufacturing a light emitting diode. In some embodiment, the method includes forming a light emitting layer on a substrate, in which the step of forming the light emitting layer on the substrate includes forming an N-type doped layer, forming a quantum well active layer on top of the N-type doped layer, and forming a P-type doped layer on top of the quantum well active layer. Optionally, the P-type doped layer includes a base layer and a concentrator on top of the base layer. The concentrator is adapted to focus and concentrate light emitting from the light emitting layer. In some embodiment, the method includes forming a light emitting layer on a substrate, in which the step of forming the light emitting layer on the substrate includes forming a P-type doped layer, forming a quantum well active layer on top of the P-type doped layer, and forming a N-type doped layer on top of the quantum well active layer. Optionally, the N-type doped layer includes a base layer and a concentrator on top of the base layer. The concentrator is adapted to focus and concentrate light emitting from the light emitting layer.

Optionally, at least one of the N-type doped layer and the P-type doped layer includes a base layer and a concentrator on top of the base layer. Optionally, both the N-type doped layer and the P-type doped layer include a base layer and a concentrator on top of the base layer. Optionally, the N-type doped layer, the quantum well active layer and the P-type doped layer sequentially arranged along a direction away from the substrate, and the P-type doped layer is etched to form the plurality of ridges.

In some embodiments, the concentrator includes a plurality of ridges spaced apart on the base layer. A width of a cross-section of at least a portion of the ridge decreases gradually along emitting direction of the light emitting layer. The top surface, the side surface and the end surface of the ridge all can emit light, thereby increases the brightness of the light emitting diode. Because a width of a cross-section of at least a portion of the ridge decreases gradually along emitting direction of the light emitting layer, light emitting out from the side walls of the ridges 132 can be redirected towards the intended light emitting direction (e.g., through the light emitting layer outwardly and substantially away from the substrate).

Figure 2A:
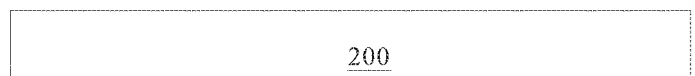
FIG. 2A is a diagram illustrating the structure of a substrate of the light emitting diode in one embodiment.
Figure 2B:
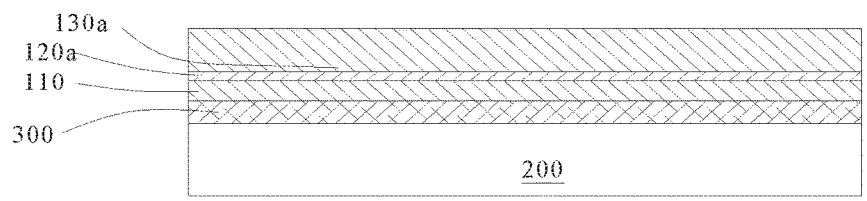
FIG. 2B is a diagram illustrating the structure of a light emitting layer, a buffer layer, and a substrate in one embodiment.
Figure 2C:
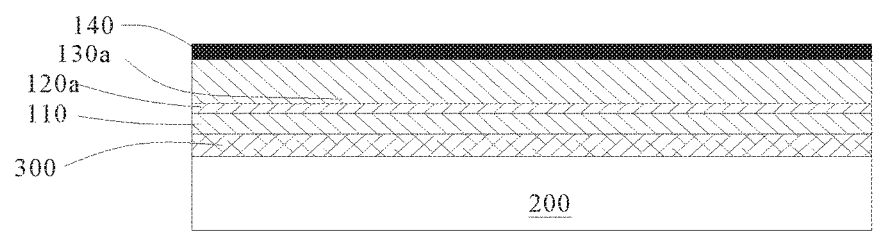
FIG. 2C is a diagram illustrating the structure of a mask layer, a light emitting layer, a buffer layer, and a substrate in one embodiment.
Figure 2D:
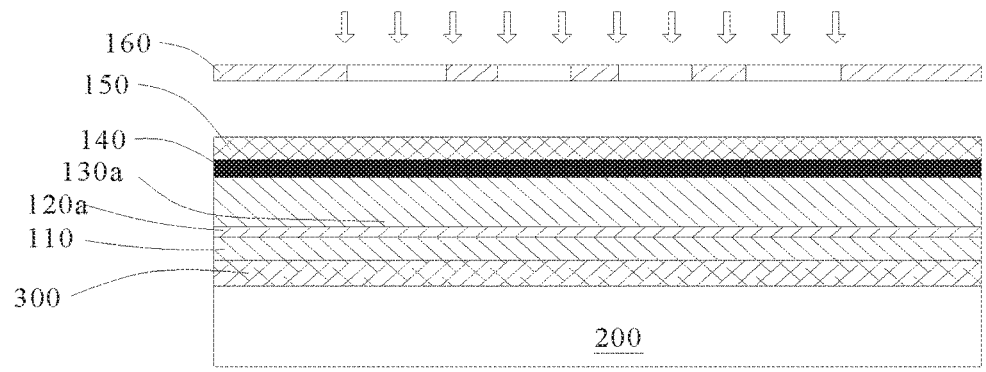
FIG. 2D shows the formation and exposure of a photoresist layer on top of the mask layer of FIG. 2C.
Figure 2E:
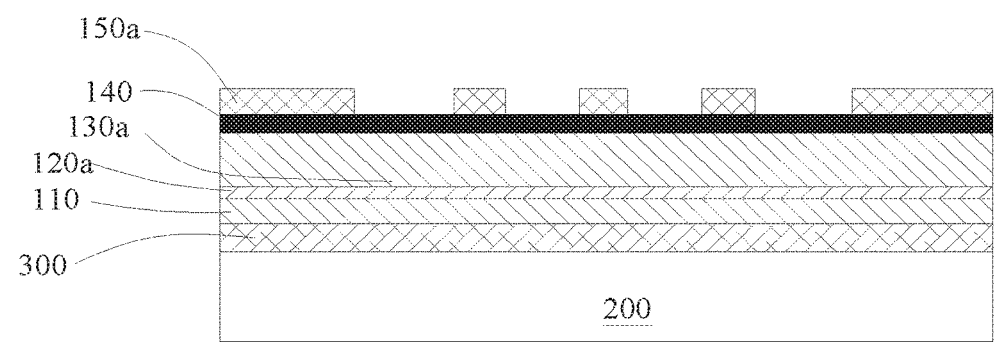
FIG. 2E shows the photoresist layer of FIG. 2D after development.
Figure 2F:
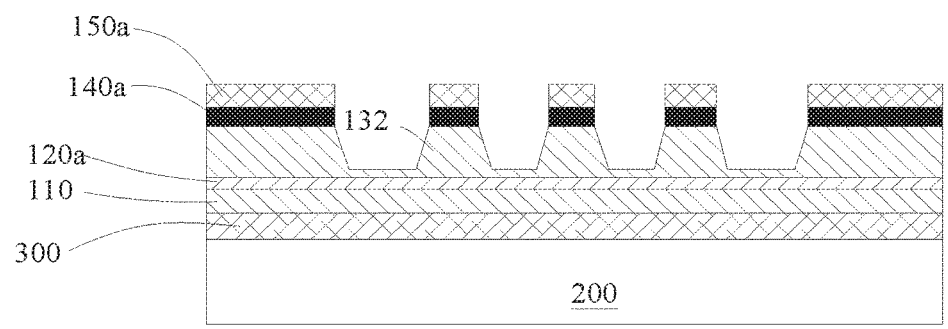
FIG. 2F shows a light emitting layer in FIG. 2E after a P-type doped layer being etched.

FIGS. 2B-2F illustrate a method of forming a light emitting layer in an embodiments. Specifically, FIG. 2B shows the structure of a light emitting layer, a buffer layer, and a substrate in the embodiment. FIG. 2C shows the structure of a mask layer, a light emitting layer, a buffer layer, and a substrate in the embodiment. FIG. 2D shows the formation and exposure of a photoresist layer on top of the mask layer of FIG. 2C. FIG. 2E shows the photoresist layer of FIG. 2D after development. FIG. 2F shows the light emitting layer of FIG. 2E after the P-type doped layer being etched.

Figure 2G:
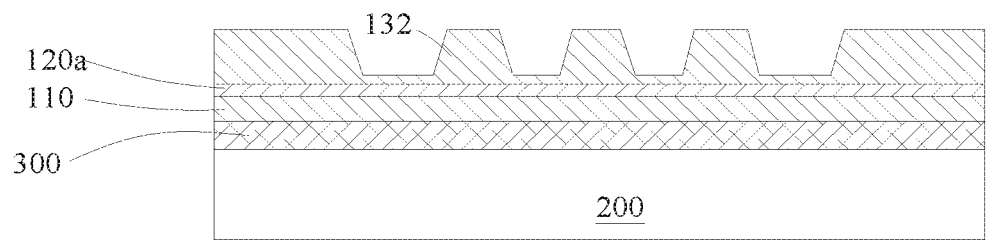
FIG. 2G shows the light emitting layer in FIG. 2F after removal of the mask pattern layer.

In some embodiments, the method of forming a light emitting layer includes forming an N-type doped layer 110 (FIG. 2B); forming a quantum well active layer 120a on top of the N-type doped layer 110 (FIG. 2B); forming a P-type doped layer 130a on top of the quantum well active layer 120a (FIG. 2B). Optionally, the method further includes forming a mask pattern 140a comprising a plurality of strips disposed spaced apart on top of the P-type doped layer 130a (FIG. 2C). Optionally, the method further includes etching the P-type doped layer 130a to form a plurality of ridges 132 having a spacing and a top surface shape corresponding to those of the plurality of strips (FIGS. 2F and 2G). The area of the P-type doped layer 130a covered by the mask pattern 140a will not be etched, thereby forming the plurality of ridges 132. Optionally, a width of a cross-section of at least a portion of the ridge decreases gradually along emitting direction of the light emitting layer. Optionally, the plurality of ridges 132 are integrally formed with a base layer as a single body. Optionally, the portion of the ridge 132 has a cross-section selected from the group consisting of trapezoid, triangle, arch, and semicircle. The plurality of ridges 132 can have a same shape or different shapes. Optionally, the plurality of ridges 132 can have a same shape for manufacturing convenience.

The mask pattern 140a can be made of any suitable material. Optionally, the material for making mask pattern 140a includes a hard mask film such as silicon dioxide or a metal. Optionally, the step of forming the mask pattern includes forming a mask layer 140 on top of the P-type doped layer 130a (FIG. 2C); forming a photoresist layer 150 on top of the mask layer 140 (FIG. 2D); forming a photoresist pattern 150a corresponding to the mask pattern 140a (FIG. 2E); and etching the mask layer to form the mask pattern 140a (FIG. 2F).

The photoresist pattern 150a can be formed by, e.g., photolithography. As shown in FIG. 2D, a mask plate 160 can be placed on top of the photoresist layer 150. The photoresist layer 150 is then developed and exposed to obtain the photoresist pattern 150a.

The P-type doped layer 130a can be etched by dry etching or wet etching. Examples of dry etching methods include, but are not limited to, reactive ion etching (RIE), deep reactive ion etching (DRIE), inductively coupled plasma etching (ICP), electron cyclotron resonance etching (ECR), and ion beam etching, and laser machining. Various etching gas may be used for dry etching. Examples of plasma etching gas (e.g., for dry etching a P-type doped gallium nitride) include, but are not limited to, boron chloride ($BCl_3$) and chloride ($Cl_2$). Prior to the plasma etching procedure, the plasma etching gas is plasmatized.

Various etching solutions may be used for wet etching. Examples of etching solutions for wet etching (e.g., wet etching a P-type doped gallium nitride) include, but are not limited to, hydrochloric acid solution, phosphoric acid solution, hydrofluoric acid solution, potassium hydroxide solution, aqua regia, potassium persulfate solution, sodium pyroborate solution, hydrogen peroxide solution, oxalic acid solution, ammonium fluoride solution, hydroiodic acid solution, and potassium iodide solution.

In some embodiments, the method of manufacturing a light emitting diode further includes a step of forming a transparent protective layer on the light emitting layer. Optionally, the transparent protective layer includes silicon oxide or polytetraethylene. Optionally, the protective layer has a relatively small refractive index, e.g., ≤2.3. Optionally, the protective layer is formed by a plasma-enhanced chemical vapor deposition (PECVD) process.

In some embodiments, the method of manufacturing a light emitting diode further includes a step of forming a buffer layer on the substrate prior to forming the light emitting layer. Optionally, the buffer layer is formed by a metal-organic chemical vapor deposition (MOCVD) process. Optionally, the buffer layer 300 is made of aluminum nitride, aluminum gallium nitride, or gallium nitride. Optionally, the buffer layer has a thickness in the range of around 1.5 µm to around 2.5 µm.

Figure 2H:
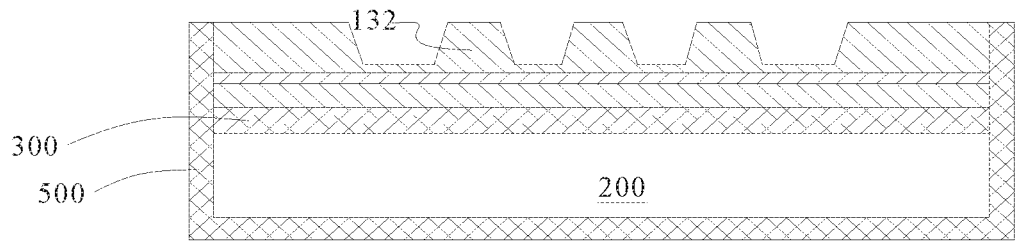
FIG. 2H shows the light emitting layer in FIG. 2G with the addition of a reflective layer.

In some embodiments, the substrate is made of a transparent material. Optionally, the method of manufacturing a light emitting diode can further include a step of forming a reflective layer 500 disposed on a bottom surface of the substrate and/or a side wall of the light emitting layer 100, reflecting light towards the intended light emitting direction, e.g., towards to the top surface of the light emitting layer 100, through the light emitting layer 100 outwardly and substantially away from the substrate 200 (FIG. 2H). Optionally, the reflective layer 500 is disposed on both the bottom and the side wall of the light emitting diode. Optionally, the reflective layer 500 is disposed only on the bottom of the light emitting diode. Optionally, the reflective layer 500 is disposed only on the side wall of the light emitting diode. Optionally, the reflective layer 500 is disposed on top of the substrate 200 (e.g., a surface of the substrate 200 proximal to the light emitting layer 100). Optionally, the reflective layer 500 is disposed on top of the substrate 200 and/or the side wall of the light emitting diode. The reflective layer 500 can be made of any suitable material. Optionally, the reflective layer 500 comprises silver and/or nickel. Optionally, the reflective layer 500 is formed by a magnetron sputtering process or a vapor deposition process. Optionally, the reflective layer 500 has a thickness around 0.5 µm. Optionally, the step of forming the reflective layer 500 is the last step of manufacturing the light emitting diode. Optionally, the reflective layer 500 is formed before forming the electrode of the light emitting diode.

Figure 2I:
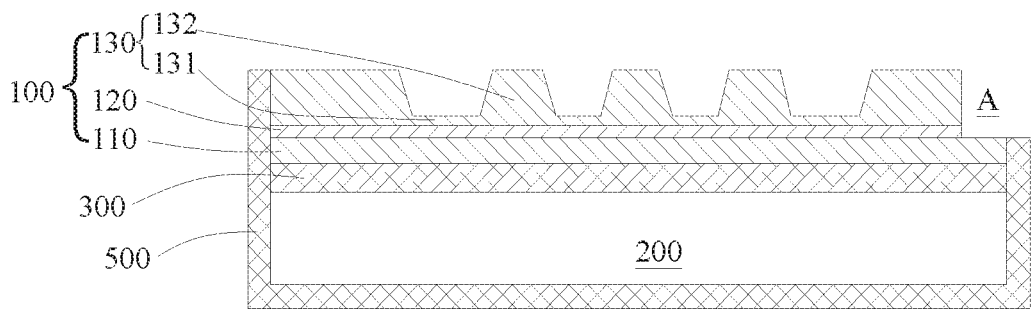
FIG. 2I shows the light emitting layer in FIG. 2H after the formation of a notch for disposing an electrode.

In some embodiments, the light emitting diode includes an electrode. Optionally, the method of forming the light emitting layer further includes etching the P-type doped layer having the plurality of ridges 132 and the active layer 120a to form a notch A (FIG. 2I). Optionally, the notch A extends through a portion of the P-type doped layer and a portion of the quantum well active layer, exposing a portion of the top surface of the N-type doped layer. Optionally, the notch is located on a peripheral side of the light emitting layer.

Based on the above, the method of manufacturing the light emitting diode in some embodiments further includes forming an electrode. Optionally, the electrode includes a P-type electrode plate on the P-type doped layer, an N-type electrode plate on the portion of the top surface of the N-type doped layer exposed by the notch, a P-type transparent electrode connected to the P-type electrode plate, and an N-type transparent electrode connected to the N-type electrode plate. Optionally, the P-type transparent electrode and the N-type transparent electrode are spaced apart and not connected. Optionally, the P-type electrode plate and the N-type electrode plate are disposed along two peripheral sides of the light emitting layer, respectively. Optionally, the P-type electrode plate includes a P-type ohmic contact electrode plate in contact with the P-type doped layer and a P-type metal electrode plate in contact with the P-type ohmic contact electrode plate. Optionally, the N-type electrode plate includes an N-type ohmic contact electrode plate in contact with the N-type doped layer and an N-type metal electrode plate in contact with the N-type ohmic contact electrode plate. Optionally, the P-type transparent electrode includes a P-type ohmic contact electrode on the light emitting layer and a P-type transparent conductive electrode on the P-type ohmic contact electrode. Optionally, the N-type transparent electrode includes an N-type ohmic contact electrode on the light emitting layer and an N-type transparent conductive electrode on the N-type ohmic contact electrode.

Optionally, the P-type ohmic contact electrode plate is connected to the P-type ohmic contact electrode. Optionally, the N-type ohmic contact electrode plate is connected to the N-type ohmic contact electrode. Optionally, the P-type metal electrode plate is connected to the P-type transparent conductive electrode. Optionally, the N-type metal electrode plate is connected to the N-type transparent conductive electrode.

In some embodiments, the step of forming the electrode includes forming a metal pattern corresponding to the P-type electrode plate and the N-type electrode plate on the surface of the light emitting layer; and forming a transparent electrode pattern corresponding to the P-type transparent electrode and the N-type transparent electrode. Optionally, the step further includes annealing the metal pattern and the transparent electrode pattern under a nitrogen atmosphere; and forming the P-type electrode plate having a P-type ohmic contact electrode plate and a P-type metal electrode plate, the N-type electrode plate having an N-type ohmic contact electrode plate and an N-type metal electrode plate, the P-type transparent electrode having a P-type ohmic contact electrode and a P-type transparent conductive electrode, and the N-type transparent electrode having an N-type ohmic contact electrode and an N-type transparent conductive electrode.

Optionally, an annealing temperature in the range of 450° C. to 550° C. is used for annealing. Optionally, the annealing temperature is around 550° C. when the metal pattern is made of silver and the transparent electrode pattern is made of indium tin oxide. Annealing facilitates the formation of ohmic contact layers, resulting in excellent ohmic contact between the electrode and the light emitting layer.

In some embodiments, the quantum well active layer includes a quantum barrier layer and a quantum well layer. Accordingly, in some embodiments, the step of forming a quantum well active layer on top of the N-type doped layer includes forming a quantum barrier layer on top of the N-type doped layer; and forming a quantum well layer on top of the quantum barrier layer. Optionally, the P-type doped layer comprises P-doped gallium nitride. Optionally, the N-type doped layer comprises N-doped gallium nitride. Optionally, the quantum barrier layer comprises gallium nitride and the quantum well layer comprises indium gallium nitride. Optionally, the P-type doped layer comprises P-doped gallium nitride, the N-type doped layer comprises N-doped gallium nitride, the quantum barrier layer comprises gallium nitride and the quantum well layer comprises indium gallium nitride.

In some embodiments, subsequent to the step of forming the active layer and prior to the step of forming the P-type doped layer, the step of forming the light emitting layer further includes forming an unintentionally N-type doped layer 170 (FIG. 7).

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting diode, comprising:
a base substrate; and
a first semiconductor layer on the base substrate;
a quantum well active layer on a side of the first semiconductor layer distal to the base substrate;
a second semiconductor layer on a side of the quantum well active layer distal to the first semiconductor layer;
a first electrode connected to the first semiconductor layer;
a second electrode connected to the second semiconductor layer; and
a transparent protective layer on a side of the second semiconductor layer distal to the base substrate;
wherein at least the second semiconductor layer is an uneven layer comprising a plurality of ridges adapted to concentrate light emitting from the light emitting layer;
the transparent protective layer is on a side of each of the plurality of ridges distal to the base substrate; and
the first semiconductor layer and the second semiconductor layer are two different layers selected from an N-type doped layer and a P-type doped layer;
wherein the light emitting diode comprises a notch extending through a portion of the second semiconductor layer and a portion of the quantum well active layer to expose a portion of a top surface of the first semiconductor layer;
the notch is adjacent to peripheries of the second semiconductor layer and the quantum well active layer; and
the first electrode extends through the notch to be in direct contact with the portion of the top surface of the first semiconductor layer.

2. The light emitting diode of claim 1, wherein the N-type doped layer, the quantum well active layer and the P-type doped layer sequentially arranged along a direction away from the base substrate, and the P-type doped layer is the uneven layer.

3. The light emitting diode of claim 1, wherein the second semiconductor layer comprises a base layer and the plurality of ridges spaced apart on the base layer, a width of a cross-section of at least a portion of each of the plurality of ridges decreases gradually along emitting direction of the light emitting layer.

4. The light emitting diode of claim 3, wherein each of the plurality of ridges has a cross-section selected from the group consisting of trapezoid, triangle, arch, and semicircle.

5. The light emitting diode of claim 3, wherein the plurality of ridges are integrally formed with the base layer as a single body.

6. The light emitting diode of claim 1, wherein the base substrate is made of a transparent material; the light emitting diode further comprises a reflective layer disposed on a bottom surface of the base substrate and a side wall of the light emitting diode, reflecting light towards the light emitting layer.

7. The light emitting diode of claim 6, wherein the reflective layer comprises silver and/or nickel.

8. The light emitting diode of claim 1, further comprising a buffer layer sandwiched between the light emitting layer and the base substrate.

9. The light emitting diode of claim 1, wherein the transparent protective layer is substantially throughout an entirety of a surface of the second semiconductor layer.

10. The light emitting diode of claim 1, wherein the transparent protective layer comprises silicon oxide or polytetrafluoroethylene.

11. The light emitting diode of claim 1, further comprising:
- a P-type electrode plate on the P-type doped layer; and
- an N-type electrode plate on the N-type doped layer;
- wherein the P-type electrode plate and the N-type electrode plate are disposed along two peripheral sides of the light emitting diode, respectively;
- wherein the first electrode and the second electrode are two different electrodes selected from a P-type transparent electrode plate and an N-type transparent electrode plate;
- wherein the P-type transparent electrode is connected to the P-type electrode plate;
- the N-type transparent electrode is connected to the N-type electrode plate; and
- the P-type transparent electrode and the N-type transparent electrode are spaced apart and not connected.

12. The light emitting diode of claim 11, wherein the P-type transparent electrode and the N-type transparent electrode are selected from the group consisting of comb electrode, branched electrode, toroid electrode, and spiral-wound electrode.

13. The light emitting diode of claim 11, wherein the P-type electrode plate comprises a P-type ohmic contact electrode plate in contact with the P-type doped layer and a P-type metal electrode plate in contact with the P-type ohmic contact electrode plate, the N-type electrode plate comprises an N-type ohmic contact electrode plate in contact with the N-type doped layer and an N-type metal electrode plate in contact with the N-type ohmic contact electrode plate, the P-type transparent electrode comprises a P-type ohmic contact electrode on the light emitting layer and a P-type transparent conductive electrode on the P-type ohmic contact electrode, and the N-type transparent electrode comprises an N-type ohmic contact electrode on the light emitting layer and an N-type transparent conductive electrode on the N-type ohmic contact electrode.

14. The light emitting diode of claim 1, wherein the quantum well active layer comprises a quantum barrier layer disposed on the first semiconductor layer and a quantum well layer disposed on the quantum barrier layer.

15. The light emitting diode of claim 14, wherein the P-type doped layer comprises P-doped gallium nitride, the N-type doped layer comprises N-doped gallium nitride, the quantum barrier layer comprises gallium nitride and the quantum well layer comprises indium gallium nitride.

16. The light emitting diode of claim 1, further comprising an unintentionally doped N-type doped layer.

17. A method of manufacturing a light emitting diode, comprising forming a light emitting layer on a base substrate, wherein the step of forming the light emitting layer on the base substrate comprising:
- forming a first semiconductor layer on a base substrate;
- forming a quantum well active layer on a side of the first semiconductor layer distal to the base substrate;
- forming a second semiconductor layer on a side of the quantum well active layer distal to the first semiconductor layer;
- forming a first electrode connected to the first semiconductor layer;
- forming a second electrode connected to the second semiconductor layer; and
- forming a transparent protective layer on a side of the second semiconductor layer distal to the base substrate;
- wherein at least the second semiconductor layer is formed as an uneven layer comprising a plurality of ridges adapted to concentrate light emitting from the light emitting layer;
- the transparent protective layer is formed on a side of each of the plurality of ridges distal to the base substrate; and
- the first semiconductor layer and the second semiconductor layer are two different layers selected from an N-type doped layer and a P-type doped layer
- wherein the light emitting diode is formed to comprise a notch extending through a portion of the second semiconductor layer and a portion of the quantum well active layer to expose a portion of a top surface of the first semiconductor layer;
- the notch is formed to be adjacent to peripheries of the second semiconductor layer and the quantum well active layer; and
- the first electrode is formed to extend through the notch to be in direct contact with the portion of the top surface of the first semiconductor layer.

18. The method of claim 17, wherein the N-type doped layer, the quantum well active layer and the P-type doped layer sequentially arranged along a direction away from the base substrate, and the P-type doped layer is formed as the uneven layer comprising the plurality of ridges.

19. The method of claim 17, wherein each of the plurality of ridges is formed to have a cross-section selected from the group consisting of trapezoid, triangle, arch, and semicircle.

20. The method of claim 17, wherein forming the second semiconductor layer comprises:
- forming a base layer; and
- forming the plurality of ridges on spaced apart on the base layer;
- wherein the plurality of ridges are formed so that a width of a cross-section of at least a portion of each of the plurality of ridges decreases gradually along emitting direction of the light emitting layer.

* * * * *